(12) United States Patent
Chen et al.

(10) Patent No.: US 7,486,506 B2
(45) Date of Patent: Feb. 3, 2009

(54) MOUNTING ASSEMBLY FOR ENCLOSURE COVER

(75) Inventors: Yun-Lung Chen, Shenzhen (CN); Yong-Zhou Wu, Shenzhen (CN); Quan-Guang Du, Shenzhen (CN); Yu-Ming Xiao, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 160 days.

(21) Appl. No.: 11/309,045

(22) Filed: Jun. 13, 2006

(65) Prior Publication Data

US 2007/0217137 A1    Sep. 20, 2007

(30) Foreign Application Priority Data

Mar. 14, 2006    (CN)    ......... 2006 2 0056551

(51) Int. Cl.
*H05K 5/00* (2006.01)
*H05K 7/00* (2006.01)
*A47B 81/00* (2006.01)
*A47B 97/00* (2006.01)

(52) U.S. Cl. ............ 361/683; 312/223.2; 312/223.3

(58) Field of Classification Search ........... 361/681, 361/683; 312/223.2, 223.3
See application file for complete search history.

(56) References Cited

U.S. PATENT DOCUMENTS

| | | | | |
|---|---|---|---|---|
| 5,743,606 A * | 4/1998 | Scholder | ............... | 312/223.2 |
| 5,967,633 A * | 10/1999 | Jung | ............... | 312/223.2 |
| 6,054,662 A * | 4/2000 | Hrehor et al. | ............ | 200/332 |
| 6,273,532 B1 | 8/2001 | Chen et al. | | |
| 6,354,680 B1 * | 3/2002 | Lin et al. | ............ | 312/223.2 |
| 6,367,896 B1 * | 4/2002 | Peng et al. | ............ | 312/223.2 |
| 6,382,744 B1 | 5/2002 | Xiao | | |
| 6,457,788 B1 * | 10/2002 | Perez et al. | ............ | 312/265.5 |
| 6,924,975 B2 * | 8/2005 | Lai | ............ | 361/683 |
| 7,253,359 B2 * | 8/2007 | Chen et al. | ............ | 174/50 |
| 7,277,277 B2 * | 10/2007 | Bang | ............ | 361/683 |
| 2001/0030429 A1 * | 10/2001 | Yen et al. | ............ | 292/207 |
| 2003/0151334 A1 * | 8/2003 | Chen et al. | ............ | 312/223.2 |
| 2005/0023023 A1 * | 2/2005 | Fan et al. | ............ | 174/66 |

* cited by examiner

*Primary Examiner*—Jayprakash N Gandhi
*Assistant Examiner*—Anthony M Haughton
(74) *Attorney, Agent, or Firm*—Wei Te Chung (57) ABSTRACT

A mounting assembly includes a chassis having a rear wall, a cover slidably mounted to the chassis in a first direction, and a clamping member mounted on the cover. The rear wall has a positioning portion thereon. The clamping member has a cantilever thereon. The cantilever has a locking portion at a free end thereof for engaging with the positioning portion, and a pressing portion at an opposite end thereof for urging the locking portion to disengage from the positioning portion. When the pressing portion of the clamping member is pressed downward in a second direction perpendicular to the first direction, the locking portion is raised, thereby disengaging the locking portion from the positioning portion of the chassis.

2 Claims, 11 Drawing Sheets

MOUNTING ASSEMBLY FOR ENCLOSURE COVER

FIELD OF THE INVENTION

The present invention relates to mounting assemblies for covers of electronic device enclosures, and more particularly to a mounting assembly for a cover of an enclosure for convenient assembly or disassembly.

DESCRIPTION OF RELATED ART

Electronic equipments, such as personal computers or servers, generally comprise an enclosure for housing various electronic components. The enclosure typically comprises a chassis having a plurality of panels connected to each other and a cover slidably mounted to the chassis with screws or similar fasteners. This inevitably slows down assembly of the enclosure, and increases costs in mass production facilities. In addition, the screws or other fasteners add to the inventory in a mass production facility. The more inventory items that need to be monitored, the higher the risk of production line shutdown in the event of a shortage of inventory. Furthermore, screwdrivers or other tools are necessary for installation or removal of the enclosure cover, which causes time-consuming and laborious.

A typical computer enclosure having a mounting assembly is arranged at an end of a chassis for assembly or disassembly of a cover. The computer enclosure comprises a chassis and a cover attached to the chassis. The chassis has a latch resiliently and pivotably attached thereto. The latch forms a protrusion and an ejector. The cover has a fixing tab defining a fixing hole for engagingly receiving the protrusion of the latch therein thereby fixing the cover to the chassis. The fixing tab forms a bent end for ejection by the ejector of the latch thereby detaching the cover from the chassis. Although the computer enclosure having a mounting assembly does not need to use screwdrivers, the assembly of above-described computer enclosure having a mounting assembly is unduly complicated.

What is needed, therefore, is to provide a mounting assembly for an enclosure cover, that allows convenient installation or removal of the enclosure cover.

SUMMARY OF THE INVENTION

A mounting assembly includes a chassis having a rear wall, a cover slidably mounted to the chassis in a first direction, and a clamping member mounted on the cover. The rear wall has a positioning portion thereon. The clamping member has a cantilever as a lever thereon. The cantilever has a locking portion at a free end thereof for engaging with the positioning portion, and a pressing portion at an opposite end thereof for urging the locking portion to disengage from the positioning portion. When the pressing portion of the clamping member is pressed downward in a second direction perpendicular to the first direction, the locking portion is raised, thereby disengaging the locking portion from the positioning portion of the chassis.

Other advantages and novel features will be drawn from the following detailed description of preferred embodiment with the attached drawings, in which:

DETAILED DESCRIPTION OF THE INVENTION

Figure 1:
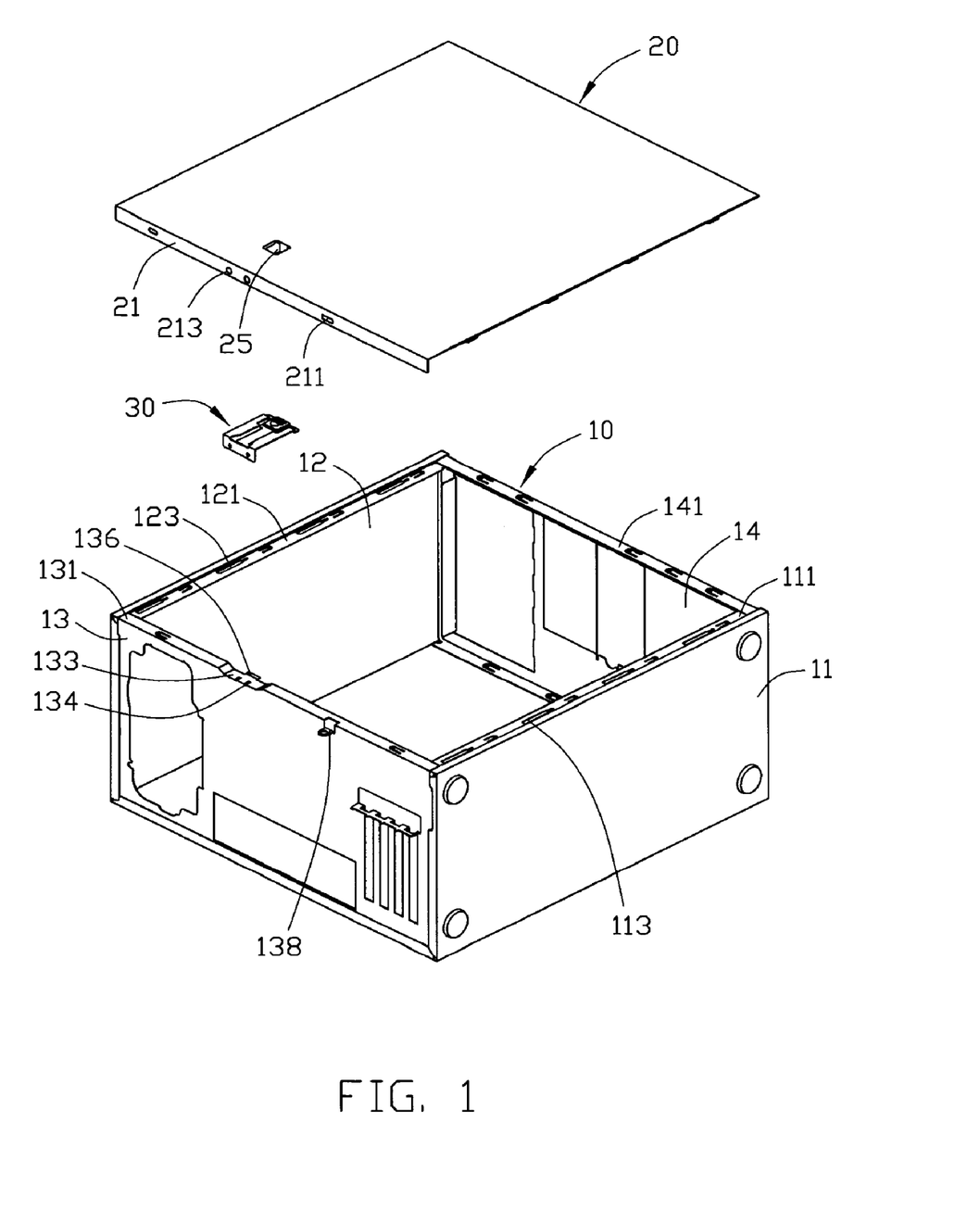
FIG. 1 is an exploded, isometric view of a mounting assembly in accordance with a first preferred embodiment of the present invention comprising an enclosure cover, a clamping member, and a chassis.

Referring to FIG. 1, a mounting assembly for an enclosure cover in accordance with a first preferred embodiment of the present invention includes a chassis 10, an enclosure cover 20, and a clamping member 30 securely mounted on the enclosure cover 20. An enclosure is often configured with the chassis 10 and the enclosure cover 20.

The chassis 10 comprises a right wall 11, a left wall 12, a rear wall 13, and a front wall 14. The right wall 11, the left wall 12, the rear wall 13, and the front wall 14 are perpendicularly connected to form a receiving space for receiving other components. The right wall 11, the left wall 12, the rear wall 13, and the front wall 14 are respectively bent inward to form corresponding flanges 111, 121, 131, 141. The flange 111 of the right wall 11 and the flange 121 of the left wall 12 define a plurality of elongated through slots 113, 123 each with a wide portion and a narrow portion therein. The flange 131 of the rear wall 13 defines a recessed portion 133 near a middle portion thereof. A positioning portion is formed on the recessed portion 133 by stamping. In the first preferred embodiment, the positioning portion is a pair of positioning holes 134 defined in the recessed portion 133. A supporting portion is formed on the recessed portion 133 of the chassis 10. In the first preferred embodiment, the supporting portion is an arcuate protruding tab 136 extending inward and upwardly from the recessed portion 133. A locking tab 138 with a circular hole defined therein, extends perpendicularly and outwardly from the rear wall 13 below the flange 131.

The enclosure cover 20 is slidably secured to the chassis 10. A rear end of the enclosure cover 20 is bent to form a flange 21. A rectangular locking hole 211 is defined in the flange 21 for extension of the locking tab 138 of the rear wall 13 therethrough. A pair of through holes 213 is defined in a middle portion of the flange 21 for extension of a corresponding locking member (not shown) therethrough. The enclosure cover 20 is formed to have an L-shaped stop tab 23 (shown in FIG. 5) by stamping, leaving a rectangular opening 25 near the stop tab 23. A plurality of L-shaped catches 24 (shown in FIG. 4) is formed on the enclosure cover 20 near two opposite long edges thereof, and the catches 24 are arranged in a line parallel to the long edges. A front end of the enclosure cover 20 forms a plurality of catches (not shown) thereon.

Figure 2:
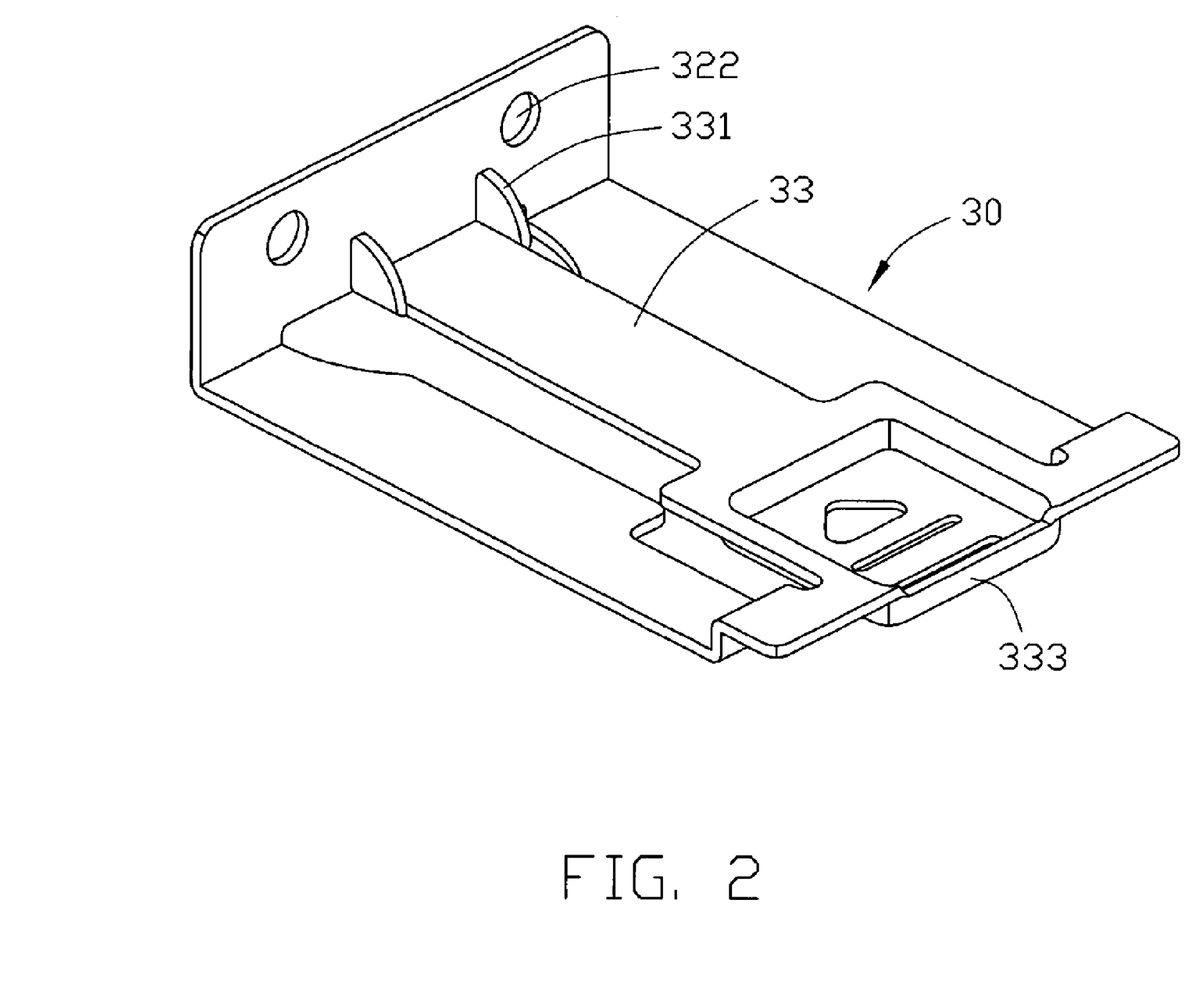
FIG. 2 is an enlarged, isometric view of the clamping member of FIG. 1, but viewed from another aspect.
Figure 3:
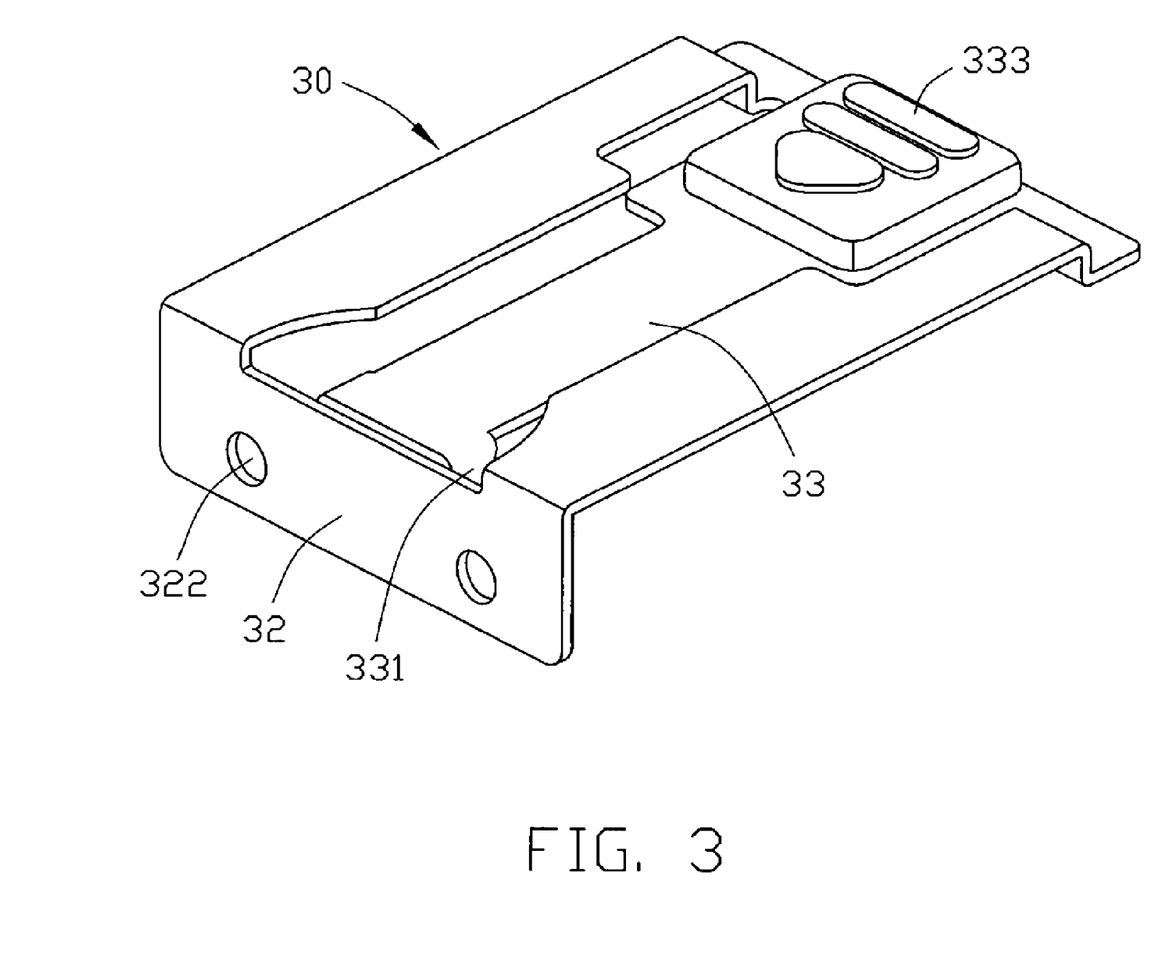
FIG. 3 is an enlarged, isometric view of the clamping member of FIG. 1.

Referring also to FIGS. 2 and 3, the clamping member 30 comprises a first end for being fixedly mounted on the flange 21 of the enclosure cover 20 and a second end opposing to the first end. The first end of the clamping member 30 is bent perpendicularly to form a mounting portion 32. A pair of mounting holes 322 is defined in the mounting portion 32 for engaging with the corresponding locking member. The locking member may be a screw or the like. A cantilever 33 with a free end for functioning as a lever, is formed on the clamping member 30 by stamping and extends from the second end of the clamping member 30 toward the first end thereof. A locking portion is formed on the cantilever 33. In the first preferred embodiment, the locking portion is a pair of opposite locking blocks 331 formed at the free end of the cantilever 33 adjacent to the first end of the clamping member 30. A pressing portion 333, is formed at a conjunctive portion between the cantilever 33 and the second end of the clamping member 30, corresponding to the opening 25 of the enclosure cover 20.

Figure 4:
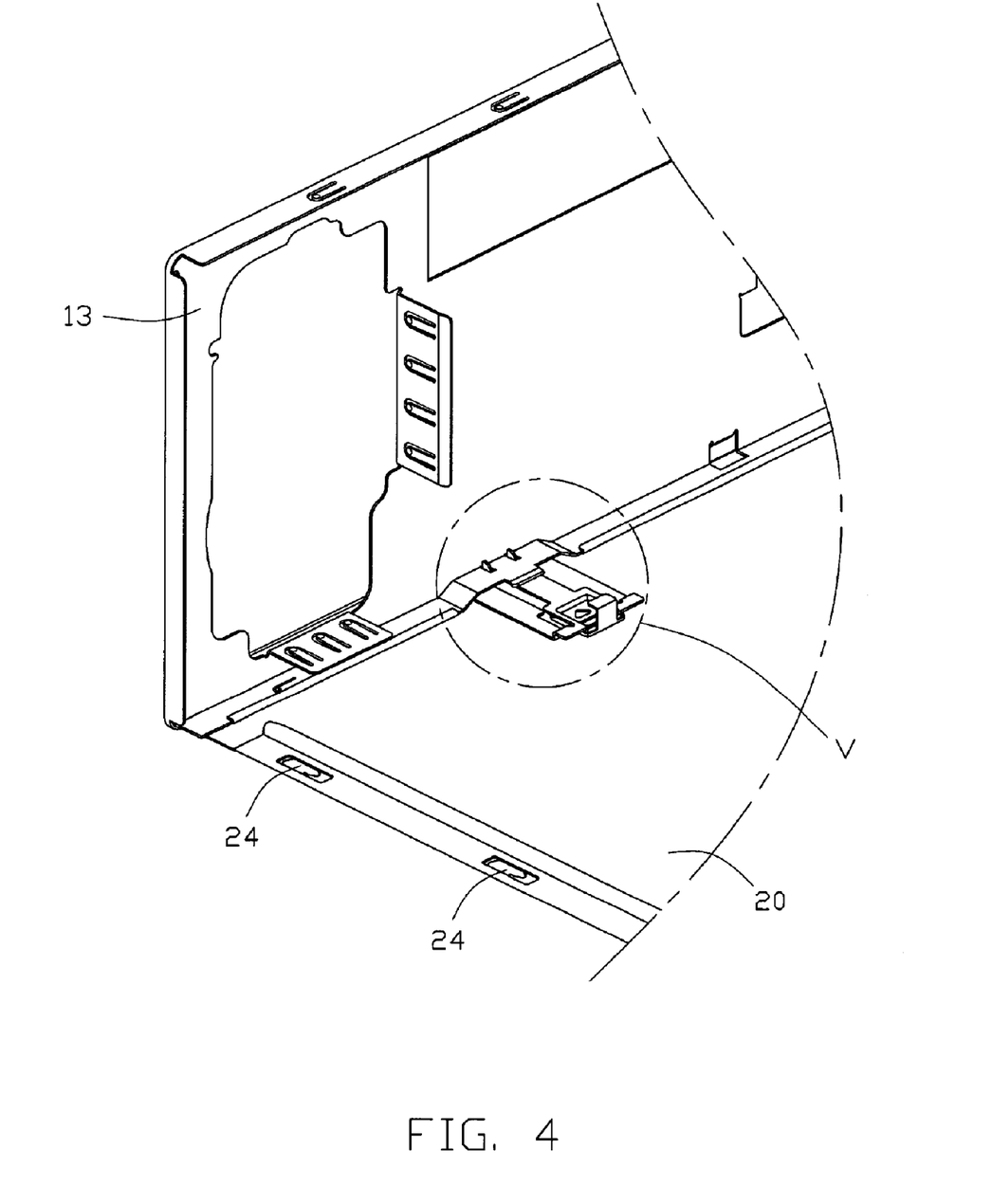
FIG. 4 is an assembled view of part of FIG. 1, but viewed from another aspect.
Figure 5:
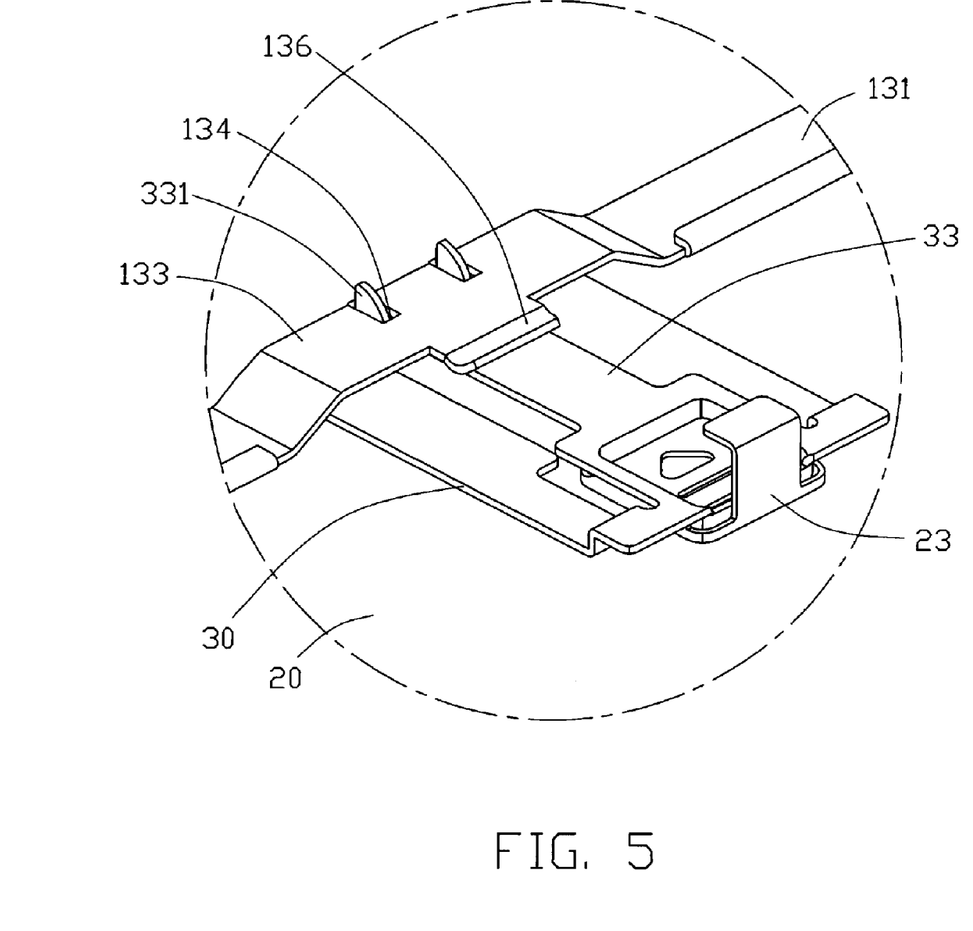
FIG. 5 is an enlarged, isometric view of part V of FIG. 4.
Figure 6:
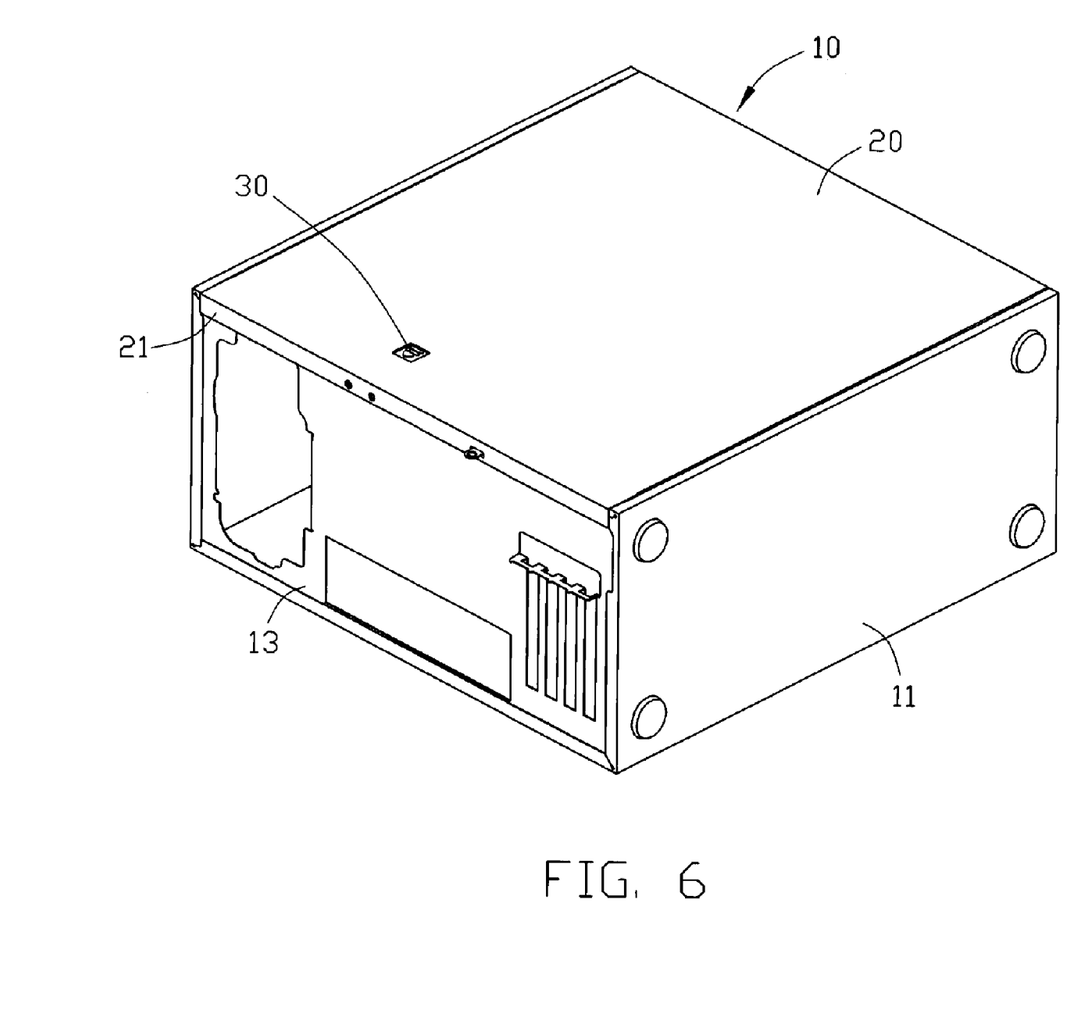
FIG. 6 is an assembled view of FIG. 1.

Referring also to FIGS. 4, 5 and 6, in assembly of the clamping member 30, the locking members extend through the through holes 213 of the flange 21 of the enclosure cover 20 to engage in the mounting holes 322 of the clamping member 30 respectively, thereby securely mounting the first end of the clamping member 30 on an inner side of the enclosure cover 20. At that time, the second end of the clamping member 30 abuts against a vertical portion of the L-shaped stop tab 23, and a horizontal portion of the L-shaped stop tab 23 is below the second end of the clamping member 30 for preventing the pressing portion 333 from moving downward overmuch. In assembly of the enclosure cover 20, the enclosure cover 20 is placed on the chassis 10 for covering the space. The catches 24 of the enclosure cover 20 are first aligned with the wide portion of the corresponding through slots 113, 123 of the chassis 10, respectively. The catches of the front end of the enclosure cover 20 are aligned with the flange 141 of the front wall 14. The locking hole 211 of the flange 21 of the enclosure cover 20 is aligned with the locking tab 138 of the rear wall 13. The locking blocks 331 of the clamping member 30 is located outside of the rear wall 13. Then, the enclosure cover 20 is pushed forwardly in a first direction relative to the chassis 10. In the first preferred embodiment, the first direction may be a horizontal direction. The enclosure cover 20 thus slides forwardly on the chassis 10 until the locking blocks 331 of the clamping member 30 engage in the corresponding positioning holes 134 of the rear wall 13. Simultaneously, the catches 24 of the enclosure cover 20 engage in the narrow portions of the corresponding through slots 113, 123 of the chassis 10. The catches of the front end of the enclosure cover 20 engage with the flange 141 of the front wall 14. The locking tab 138 of the rear wall 13 inserts through the rectangular locking hole 211 of the enclosure cover 20. Thus, the enclosure cover 20 is securely mounted on the chassis 10. At this state, the pressing portion 333 of the cantilever 33 of the clamping member 30 is located below the rectangular opening 25 of the enclosure cover 20. The protruding tab 136 abuts the cantilever 33 between the locking blocks 331 and the pressing portion 333. In addition, for the sake of security, a lock can be arranged on the locking tab 138 for preventing an unauthorized person from taking crucial components out of the enclosure.

In disassembly of the enclosure cover 20, the pressing portion 333 of the clamping member 30 is first pressed in a second direction perpendicular to the first direction. The arcuate protruding tab 136 of the rear wall 13, acting as a fulcrum, supports the cantilever 33. The locking blocks 331 pivots about the protruding tab 136 upward, thereby disengaging from the corresponding positioning holes 134 of the rear wall 13. The enclosure cover 20 is then pulled backwardly in the first direction until the enclosure cover 20 is removed from the chassis 10. Meanwhile, the catches of the front end of the enclosure cover 20 disengage from the flange 141 of the front wall 14. The catches 24 of the enclosure cover 20 disengage from the corresponding through slots 113, 123 of the chassis 10. The locking tab 138 of the rear wall 13 disengages from the locking hole 211 of the flange 21 of the enclosure cover 20.

Referring to FIGS. 7 to 11, a mounting assembly in accordance with a second preferred embodiment of the present invention comprises a chassis 10', an enclosure cover 20', a clamping member 30'.

Figure 7:
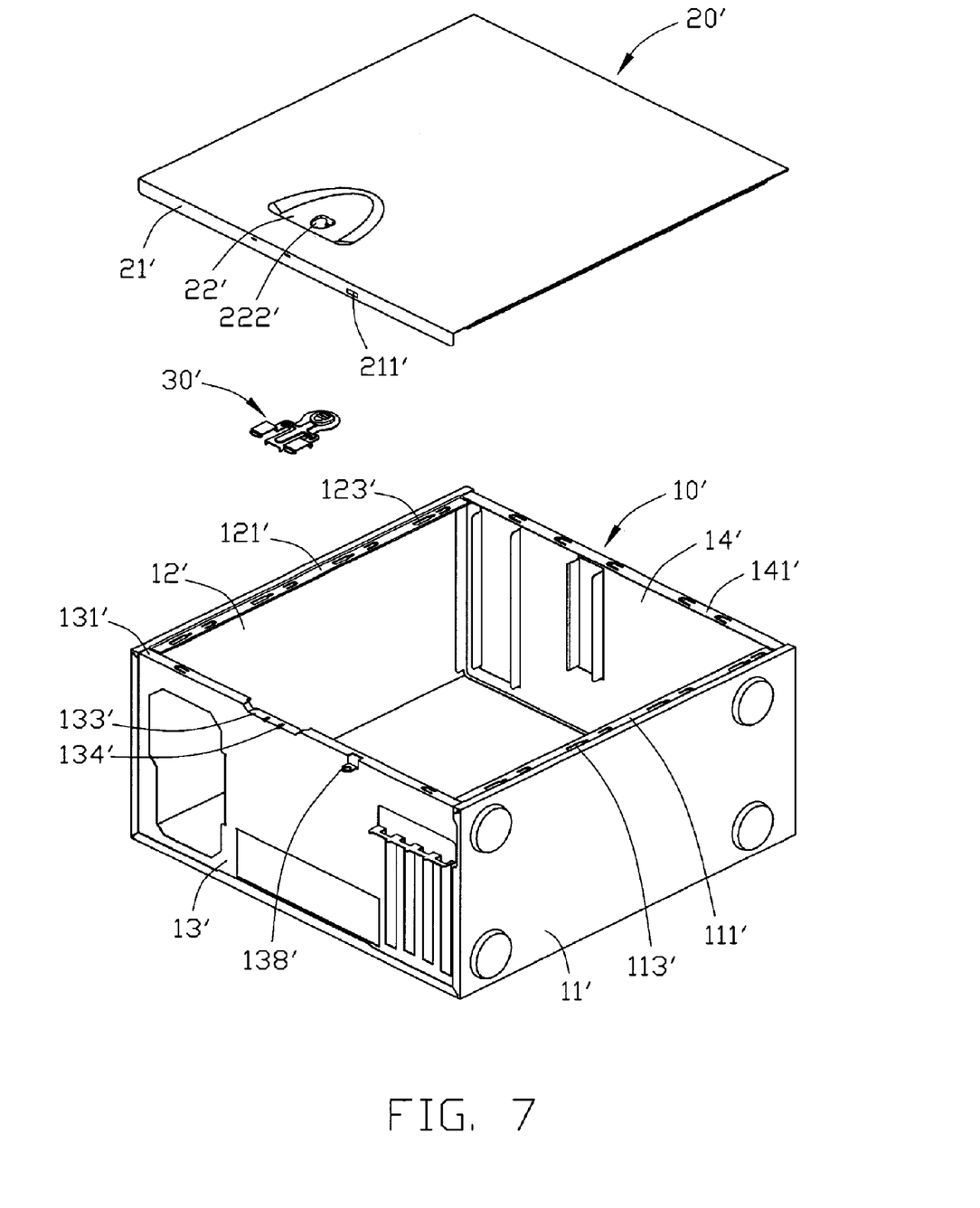
FIG. 7 is an exploded, isometric view of a mounting assembly in accordance with a second preferred embodiment of the present invention comprising an enclosure cover, a clamping member, and a chassis.
Figure 8:
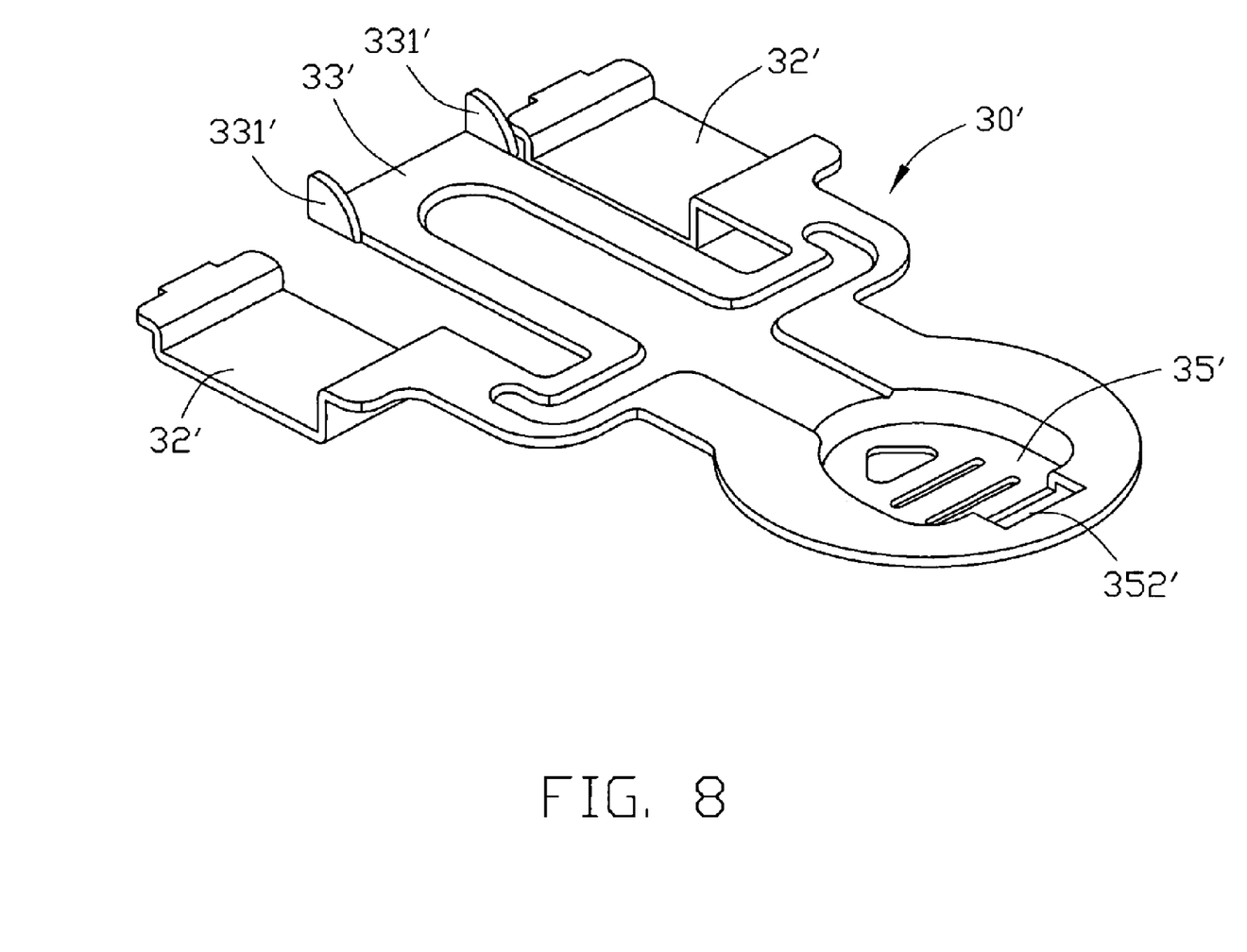
FIG. 8 is an enlarged, isometric view of the clamping member of FIG. 7, but viewed from another aspect.

Referring to FIGS. 7 and 8, the chassis 10' is similar to the chassis 10 of the first preferred embodiment, except that the chassis 10' has no arcuate protruding tab extending inward and upwardly from the recessed portion 133'.

The enclosure cover 20' is similar to the enclosure cover 20 of the first preferred embodiment. The enclosure cover 20' is slidably secured to the chassis 10'. A rear end of the enclosure cover 20' is bent to form a flange 21'. A rectangular locking hole 211' is defined in the flange 21' for extension of the locking tab 138' of the rear wall 13' therethrough. A generally semicircular recessed portion 22' is defined in an out surface of the enclosure cover 20' for conveniently pulling the enclosure cover 20'. The recessed portion 22' is formed to have an L-shaped stop tab 224' (shown in FIG. 10) by stamping, leaving a generally semicircular opening 222' near the stop tab 224'. A plurality of L-shaped catches 24' (shown in FIG. 9) is formed on the enclosure cover 20' near two opposite long edges thereof, and the catches 24' are arranged in a line parallel to the long edges. A front end of the enclosure cover 20' forms a plurality of catches (not shown) thereon.

The clamping member 30' is fixedly mounted on the enclosure cover 20' by welding. An end of the clamping member 30' is bent to form a pair of spaced mounting portions 32'. A cantilever 33' with a free end functioning as a lever, is formed on the clamping member 30' by stamping between the two mounting portions 32'. A locking portion is formed on the cantilever 33'. In the second preferred embodiment, the locking portion is a pair of opposite locking blocks 331' formed at the free end of the cantilever 33'. A pressing portion 35', opposite to the free end, is formed at the other end of the cantilever 33' corresponding to the opening 222' of the enclosure cover 20'. The cantilever 33' connects the mounting portions 32' at a conjunctive portion which is located at between the pressing portion 35' and the locking blocks 331' in the first direction. In a second direction perpendicular to the first direction, the locking blocks 331' of the cantilever 33' is spaced from the mounting portions 32'. A rectangular through hole 352' is defined in the pressing portion 35' for extension of the stop tab 224' therethrough.

Figure 9:
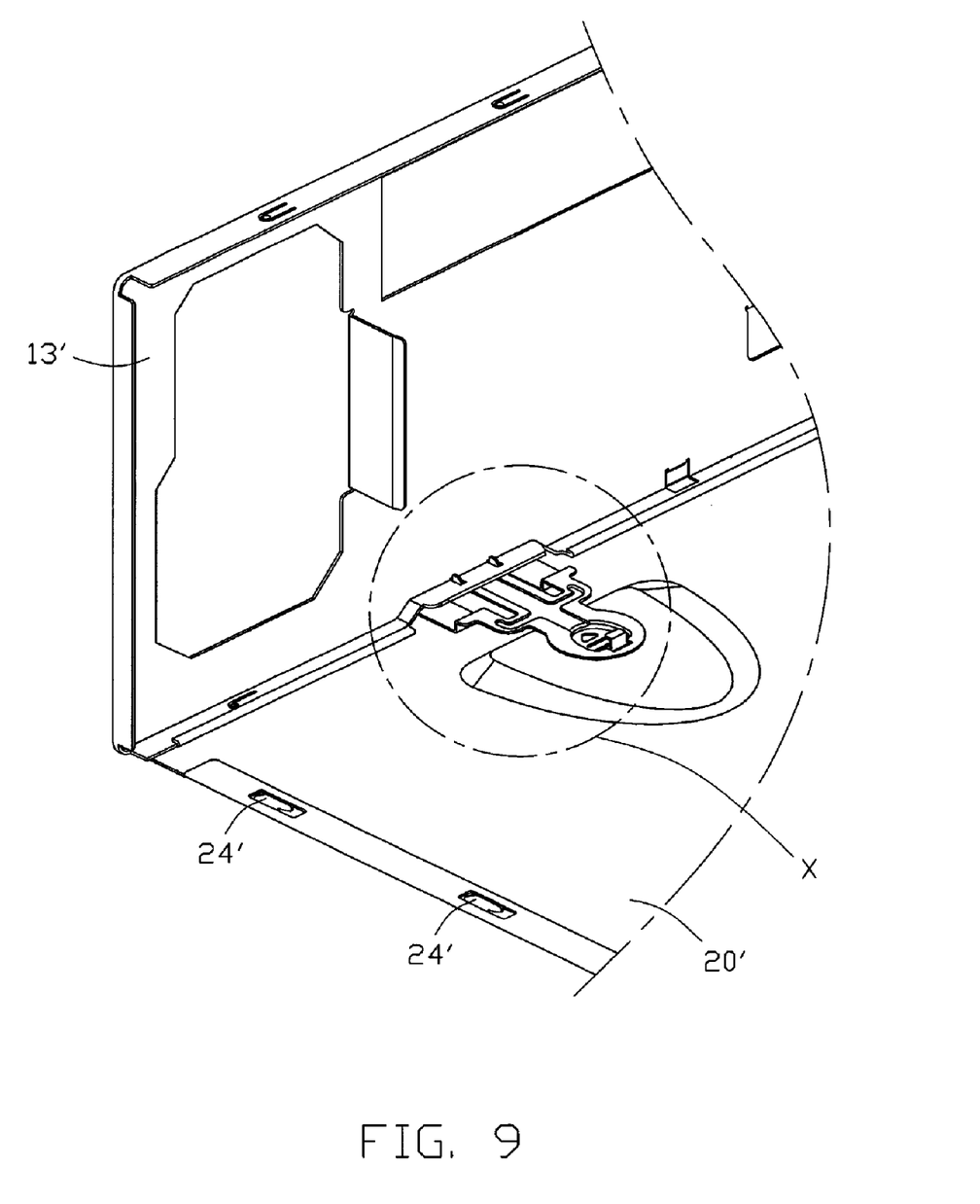
FIG. 9 is an assembled view of part of FIG. 7, but viewed from another aspect.
Figure 10:
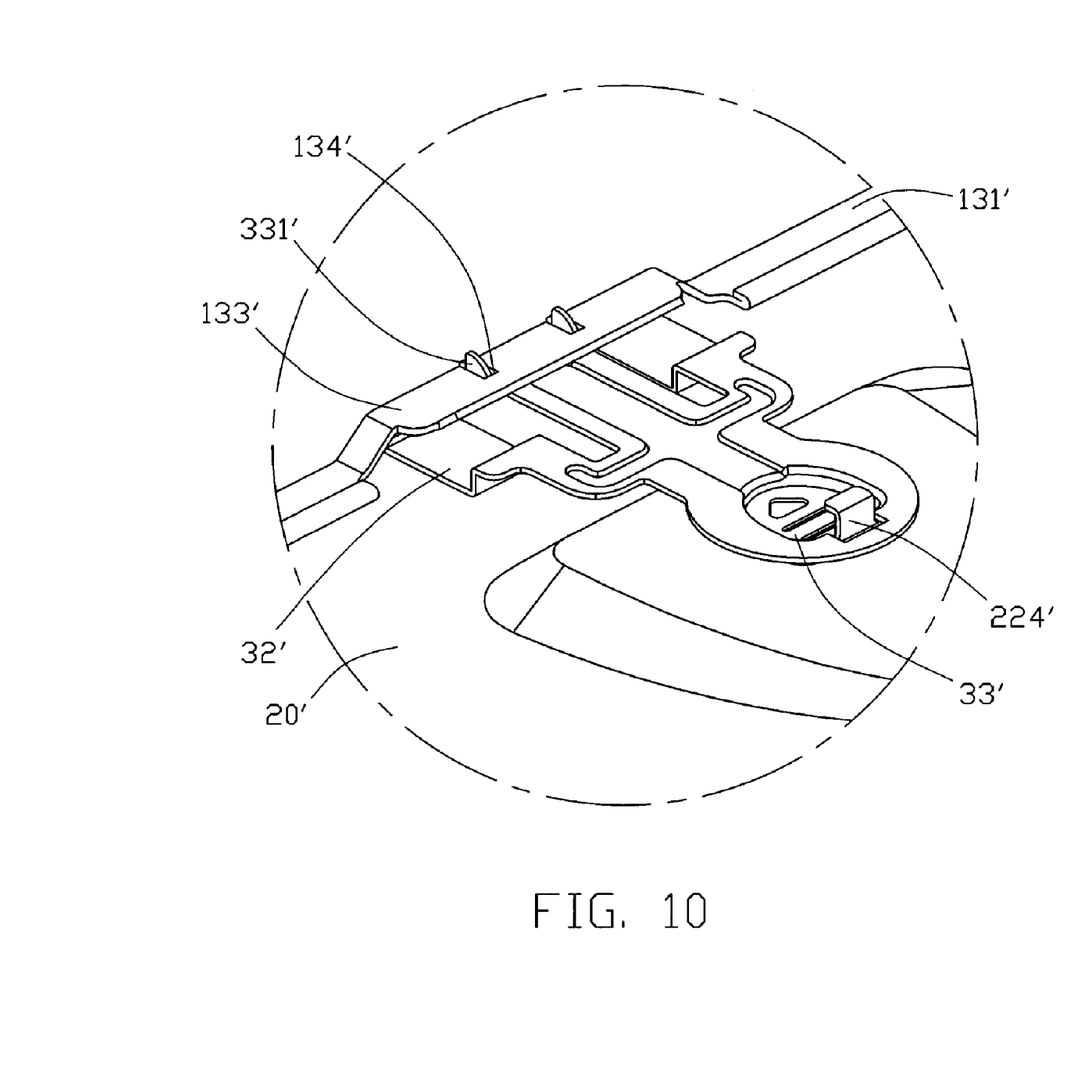
FIG. 10 is an enlarged, isometric view of part X of FIG. 9.
Figure 11:
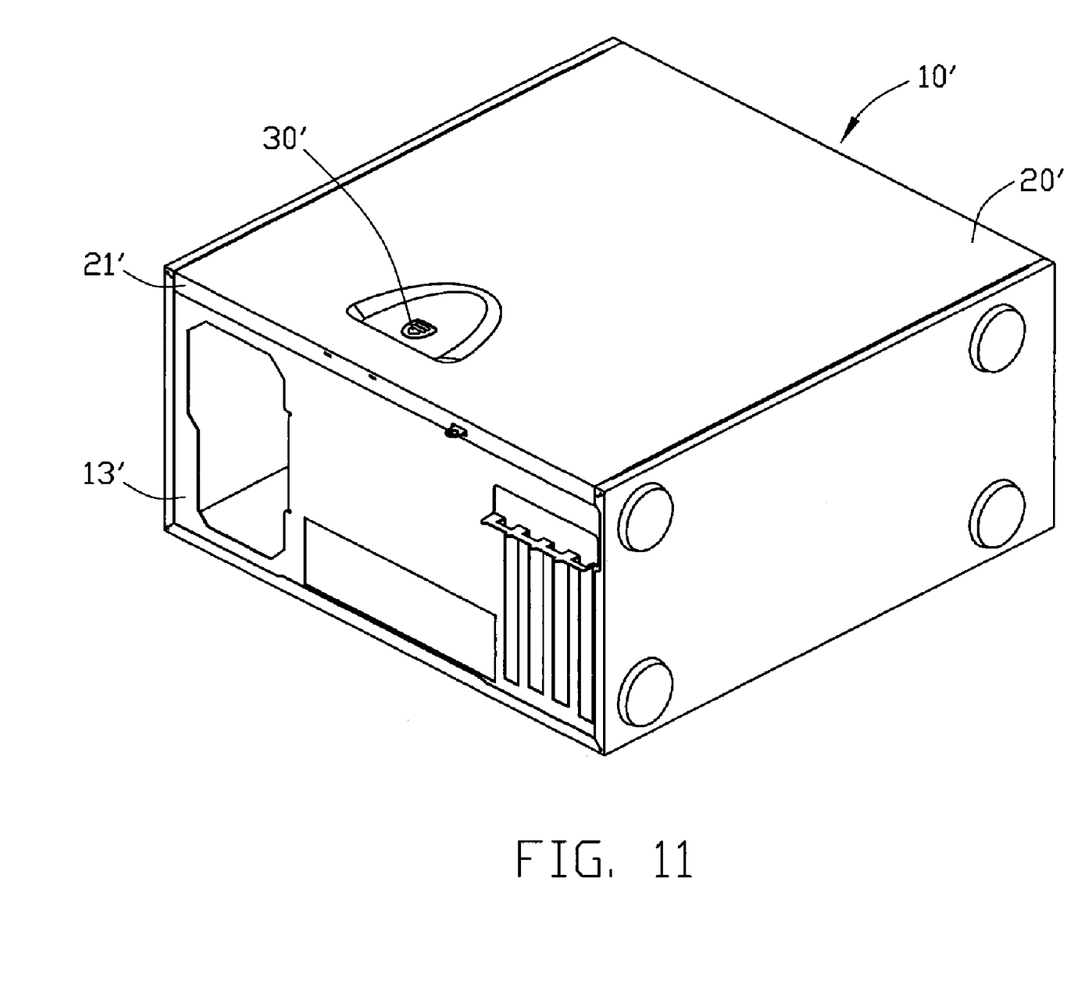
FIG. 11 is an assembled view of FIG. 7.

Referring also to FIGS. 9, 10 and 11, in assembly of the clamping member 30', the mounting portions 32' of the clamping member 30' are welded to an inner side of the enclosure cover 20'. At that time, the L-shaped stop tab 224' extends through the through hole 352' of the clamping member 30', and a horizontal portion of the L-shaped stop tab 224' is below the pressing portion 35' of the clamping member 30' for preventing the pressing portion 35' from moving downward overmuch. In assembly of the enclosure cover 20', the catches 24' of the enclosure cover 20' are first aligned with the wide portion of the corresponding through slots 113', 123' of the chassis 10'. The catches of the front end of the enclosure cover 20' are aligned with the flange 141' of the front wall 14'. The locking hole 211' of the flange 21' of the enclosure cover 20' is aligned with the locking tab 138' of the rear wall 13'. Then, the enclosure cover 20' is pushed in a first direction. In the second preferred embodiment, the first direction may be a horizontal direction. The enclosure cover 20' thus slides on the chassis 10' until the locking blocks 331' of the clamping member 30' engage in the corresponding positioning holes 134' of the rear wall 13'. Simultaneously, the catches 24' of the enclosure cover 20' engage in the narrow portions of the corresponding through slots 113', 123' of the chassis 10'. The catches of the front end of the enclosure cover 20' engage with the flange 141' of the front wall 14'. The locking tab 138' of the rear wall 13' inserts through the rectangular locking hole 211' of the enclosure cover 20'. Thus, the enclosure cover 20' is securely mounted on the chassis 10'. At this state, the pressing portion 35' of the cantilever 33' of the clamping member 30' is located below the opening 222' of the enclosure cover 20'. In addition, for the sake of security, a lock can be arranged on the locking tab 138' for preventing an unauthorized person from taking crucial components out of the enclosure.

In disassembly of the enclosure cover 20', the pressing portion 35' of the clamping member 30' is first pressed downwardly in the second direction perpendicular to the first direction. The cantilever 33' is therefore pivoted about the conjunctive portion between the cantilever 33' and the mounting portions 32' which are weld to the cover 20'. The locking blocks 331' of the cantilever 33' move upwardly, thereby disengaging from the corresponding positioning holes 134' of the rear wall 13'. The enclosure cover 20' is then pulled in the first direction until the enclosure cover 20' is removed from the chassis 10'. Meanwhile, the catches of the front end of the enclosure cover 20' disengage from the flange 141' of the front wall 14'. The catches 24' of the enclosure cover 20' disengage from the corresponding through slots 113', 123' of the chassis 10'. The locking tab 138' of the rear wall 13' disengages from the locking hole 211' of the enclosure cover 20'.

While the present invention has been illustrated by the description of preferred embodiments thereof, and while the preferred embodiments have been described in considerable detail, it is not intended to restrict or in any way limit the scope of the appended claims to such details. Additional advantages and modifications within the spirit and scope of the present invention will readily appear to those skilled in the art. Therefore, the present invention is not limited to the specific details and illustrative examples shown and described.

What is claimed is:

1. A mounting assembly comprising:
   a chassis comprising a rear wall, the rear wall having a positioning portion;
   a cover slidably mounted to the chassis in a first direction; and
   a clamping member mounted on the cover, the clamping member having a unitary cantilever formed thereon, the cantilever having a locking portion formed at a free end thereof for engaging with the positioning portion and a pressing portion formed at an opposite end thereof for urging the locking portion to disengage from the positioning portion;
   wherein when the pressing portion of the clamping member is pressed to move in a second direction perpendicular to the first direction, the locking portion is moved in a direction opposite to the second direction to disengage from the positioning portion of the chassis; and
   the cover is formed to have a stop tab for restricting movement of the pressing portion of the cantilever in the second direction.

2. A computer enclosure comprising:
   a chassis having a positioning portion and a supporting portion thereon;
   a cover slidably mounted to the chassis; and
   a clamping member mounted on the cover, the clamping member having a cantilever thereon, the cantilever having a locking portion thereon for engaging with the positioning portion of the chassis, and abutting on the supporting portion;
   wherein when the clamping member is pressed to urge the cantilever to pivot about the supporting portion, the locking portion of the clamping member is raised to disengage from the positioning portion of the chassis; and
   the cantilever comprises a pressing portion opposite to the free end of the cantilever, and the cover is formed to have a stop tab for restricting movement of the pressing portion.

* * * * *